United States Patent
Dhanapal

(10) Patent No.: US 11,043,827 B2
(45) Date of Patent: Jun. 22, 2021

(54) BATTERY PERFORMANCE ENHANCEMENT

(71) Applicant: APPLE INC., Cupertino, CA (US)

(72) Inventor: Muthukumaran Dhanapal, Sunnyvale, CA (US)

(73) Assignee: Apple Inc., Cupertino, CA (US)

(*) Notice: Subject to any disclaimer, the term of this patent is extended or adjusted under 35 U.S.C. 154(b) by 466 days.

(21) Appl. No.: 15/907,892

(22) Filed: Feb. 28, 2018

(65) Prior Publication Data

US 2019/0222045 A1    Jul. 18, 2019

Related U.S. Application Data

(60) Provisional application No. 62/618,824, filed on Jan. 18, 2018.

(51) Int. Cl.
*H02J 7/00* (2006.01)
*G01R 31/382* (2019.01)

(52) U.S. Cl.
CPC .......... *H02J 7/0047* (2013.01); *G01R 31/382* (2019.01); *H02J 7/0091* (2013.01); *H02J 7/0048* (2020.01); *H02J 7/0049* (2020.01)

(58) Field of Classification Search
CPC .................................................. H02J 7/00477
USPC ................................................. 320/132, 144
See application file for complete search history.

(56) References Cited

U.S. PATENT DOCUMENTS 6,286,109 B1 * 9/2001 Pirdy .................. G06F 1/203
320/106
2019/0123565 A1 * 4/2019 Hsiao ................ H02J 7/0029

* cited by examiner

*Primary Examiner* — Edward Tso
*Assistant Examiner* — Ahmed H Omar
(74) *Attorney, Agent, or Firm* — Fay Kaplun & Marcin, LLP

(57) ABSTRACT

A device, system, and method enhances battery performance on a user equipment. The user equipment includes a rechargeable battery, a charging circuit, and a processor. The charging circuit controls a recharging operation for the rechargeable battery. The processor determines an activity condition and a charge condition, the activity condition based on a foreground activity running on the user equipment, the charge condition based on a charge capacity of the rechargeable battery being above a capacity threshold. The processor selects a first charging rate at which the charging circuit recharges the rechargeable battery when at least one of the activity condition and the charge condition is absent. The processor selects a second charging rate when the activity condition and the charge condition are present, the second charging rate being less than the first charging rate.

20 Claims, 2 Drawing Sheets

BATTERY PERFORMANCE ENHANCEMENT

PRIORITY/INCORPORATION BY REFERENCE

This application claims priority to U.S. Provisional Application 62/618,824 entitled "Battery Performance Enhancement," filed on Jan. 18, 2018, the entirety of which is incorporated herein by reference.

BACKGROUND INFORMATION

A user equipment (UE) may be portable and utilize a limited power supply such as a battery. While untethered from a source that charges the limited power supply, the UE may perform foreground activities (e.g., user interactive applications) as well as background activities (e.g., network control operations). These activities drain the power stored in the battery. The UE is equipped with a charging component to recharge a rechargeable battery. Using a wired or wireless connection to a charging power supply (e.g., a wall outlet), the battery may remain incorporated with the UE and be recharged.

While the battery is being recharged, a user may continue to use the UE. For example, any foreground activity may be accessible and usable. In a particular example, when properly connected to a network, the user may receive an incoming call or make an outgoing call. However, the charging operation combined with the activity may create adverse effects on the charging component, the rechargeable battery, and the UE as well possibly placing a health impact on the user. For example, the charging operation while the activity is ongoing may degrade the battery and impact a longevity of the battery. In another example, heat and radiation from the UE may increase and be felt/absorbed by the user.

SUMMARY

Some exemplary embodiments are directed to a user equipment that has a rechargeable battery, a charging circuit configured to control a recharging operation for the rechargeable battery and a processor configured to determine an activity condition and a charge condition, the activity condition based on a foreground activity running on the user equipment, the charge condition based on a charge capacity of the rechargeable battery being above a capacity threshold, the processor configured to select a first charging rate at which the charging circuit recharges the rechargeable battery when at least one of the activity condition and the charge condition is absent, the processor configured to select a second charging rate when the activity condition and the charge condition are present, the second charging rate being less than the first charging rate.

Further exemplary embodiments are directed to a method performed at a user equipment comprising a rechargeable battery and a charging circuit configured to recharge the rechargeable battery. The method including determining an activity condition and a charge condition, the activity condition based on a foreground activity running on the user equipment, the charge condition based on a charge capacity of the rechargeable battery being above a capacity threshold, selecting a first charging rate at which the charging circuit recharges the rechargeable battery when at least one of the activity condition and the charge condition is absent and selecting a second charging rate when the activity condition and the charge condition are present, the second charging rate being less than the first charging rate.

Still further exemplary embodiments are directed to a charging integrated circuit that has a battery port configured to establish an electrical connection with a rechargeable battery, first circuitry for controlling a recharging operation of the rechargeable battery while the charging integrated circuit is connected to a continuous power supply and second circuitry for receiving an indication identifying a charging rate at which the rechargeable battery is recharged, wherein the indication sets the charging rate to a first charging rate at which the rechargeable battery is recharged when at least one of an activity condition and a charge condition is absent, the activity condition based on a foreground activity running on the user equipment, the charge condition based on a charge capacity of the rechargeable battery being above a capacity threshold, and wherein the indication sets the charging rate to a second charging rate when the activity condition and the charge condition are present, the second charging rate being less than the first charging rate.

DETAILED DESCRIPTION

Figure 1:
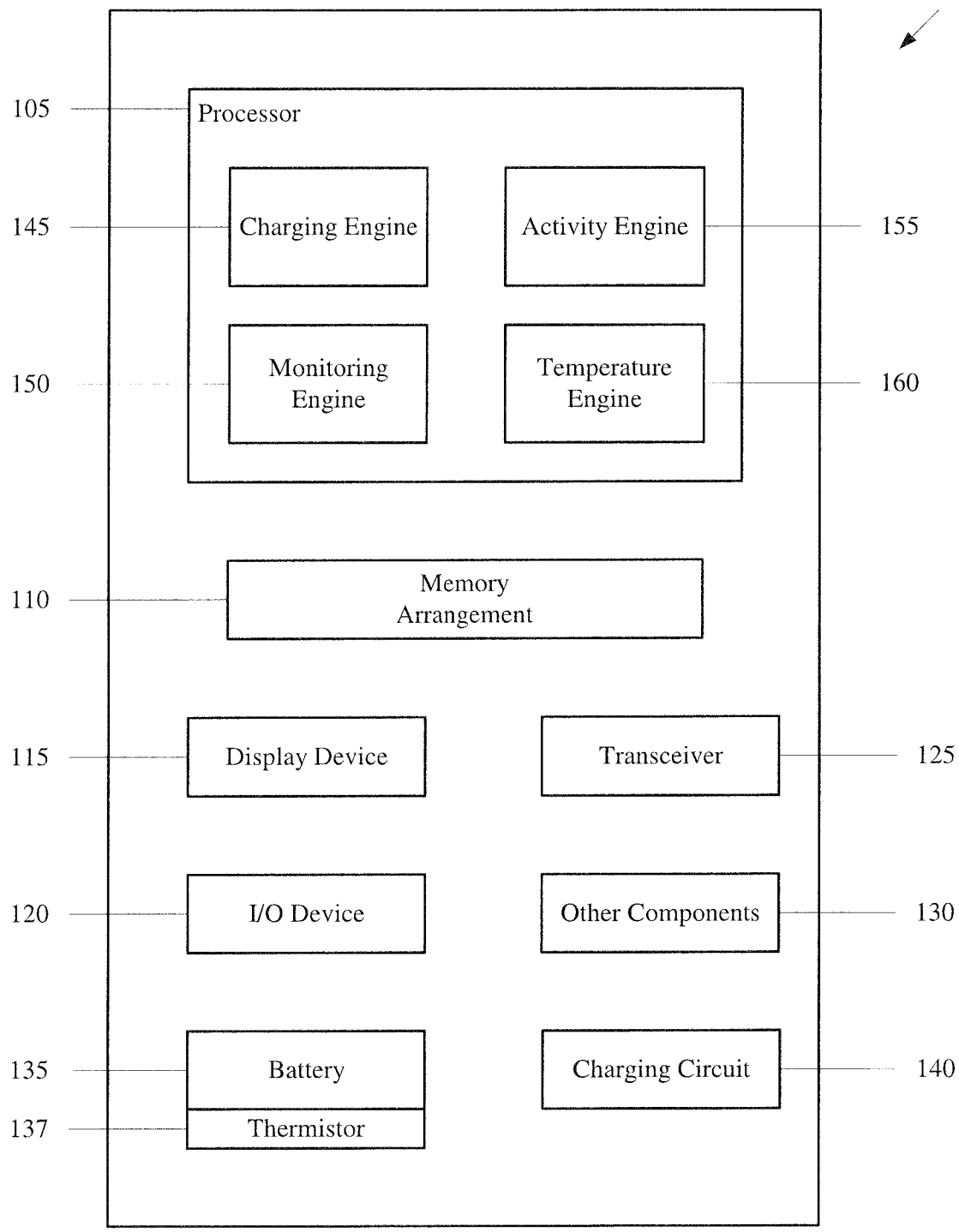
FIG. 1 shows an example user equipment according to the various exemplary embodiments described herein.

The exemplary embodiments may be further understood with reference to the following description and the related appended drawings, wherein like elements are provided with the same reference numerals. The exemplary embodiments are related to a device, system, and method for dynamically modifying a charging rate during a charging operation of a user equipment (UE). For example, the UE may be configured to monitor a charge capacity of the power supply, identify activities being performed on the UE while the power supply is being charged, and identify a temperature or other parameter of the UE and components thereof while the power supply is being charged. Based on information gathered from the charge capacity, activities, and the other parameter, the UE may select a dynamically determined charging rate and set a charging circuit or component accordingly. In this manner, adverse effects associated with use of the UE while the power supply is being charged may be prevented or decreased.

Initially, it is noted that the exemplary embodiments are described with regard to a UE and a power supply being a rechargeable battery. However, the UE and the rechargeable battery are only exemplary. The exemplary embodiments may be utilized with any device that may utilize a portable power supply and is configured to be usable while the portable power supply is being recharged. Therefore, the UE as described herein is used to represent any such device. The exemplary embodiments may utilize any type of rechargeable power supply as well and is not necessarily a rechargeable battery but may be other types of power supply components such as a capacitor, a supercapacitor, etc. Accordingly, a corresponding charging component may be used by the UE in charging the rechargeable power supply. Furthermore, it is noted that the exemplary embodiments are described with regard to retaining as much of an original capability of the battery. However, the exemplary embodiments may also be configured for other components of the UE (e.g., processor, memory, transceiver, etc.).

A battery allows a UE to be portable and untethered to a continuous power supply. With the battery being rechargeable, the UE may connect to a continuous power supply to recharge the battery. While the UE is recharging, the UE may still be allowed to be used by a user for any reason. However, use of the UE while the UE is charging may create adverse effects. Specifically, the UE may utilize a fixed charging rate based on the charging circuit or charging components from which power is drawn from the continuous power supply to recharge the battery. With additional activities being performed, heat that is generated may cause the UE, the battery, or other components to experience adverse effects.

A higher current and/or a higher voltage may increase the charging rate and decrease an amount of time required to reach a charge capacity on the battery. Charging technologies may utilize various mechanisms in software/hardware/firmware to recharge a battery. For example, wired charging mechanisms may utilize universal serial bus (USB) connections. With different USB standards (e.g., USB 1.0, USB 2.0, USB 3.0, USB 3.1, etc.), various levels of charging power (as a product of current and voltage) may be supplied. The USB standard may use a 5V bus for USB 1.0, 2.0, and 3.0 or a 5V to 20V bus for USB 3.1. Thus, in a first example, USB 1.0 or USB 2.0 may deliver a current of 500 mA for a maximum power of 2.5 W. In a second example, USB 3.0 may deliver a current of 500 mA or 900 mA for a maximum power of 4.5 W. In a third example, USB 3.1 may deliver a current of 500 mA, 900 mA, 1.5 A, 3.0 A, or 5.0 A for a maximum power of 100 W. In another example, a wireless charging mechanism may utilize inductive charging. Inductive charging devices are less efficient than the USB 3.1 standard and provide less than 100 W. Furthermore, advances in charging technology are generally aimed at higher charging rates to minimize an amount of time required to recharge the battery. In this manner, a user experience with regard to a wait time in charging the battery may be improved.

As the charging rate increases, the amount of resulting heat and/or radiation that is produced from the charging procedure also increases. Specifically, to reach the same charging capacity, a standard charging rate may have produced a particular amount of heat. However, with increased charging rates, the same amount of heat is produced in a lesser amount of time and is more likely to be retained in the UE with less time to be dissipated into the surrounding environment. Also, with increased charging rates, the molecules (e.g., ions) in the battery may move at an increased rate due to the increased charging rate and generate a corresponding amount of heat. Although the heat generated during the charging procedure may fall within standards that do not adversely affect the longevity of the battery or efficiency at which the battery operates including the charging procedure, additional components being used concurrently with the charging procedure creates additional heat. Specifically, with foreground activities utilizing components such as a processor, a display device, a transceiver, etc., electricity is required to be provided to these components (e.g., from the battery) which in turn generates additional heat. In fact, the additional chemical processes occurring at the battery to both recharge the battery and supply power to the components may further increase the amount of heat being generated. The additional heat from the foreground activities may degrade the battery. The amount of heat that is created from the charging procedure and the one or more foreground activities may cause the UE to become uncomfortable to touch by the user. It is noted that background activities may also create a certain amount of heat. For illustrative purposes, it may be assumed that the heat from the background activities is negligible or considered a part of the normal heat generated by the charging procedure. However, the exemplary embodiments may also be modified to incorporate the heat from the background activities when considering how to modify the charging rate in a manner consistent with the description herein.

The increased heat from the above sources while the battery is being recharged may increase the temperature of the UE, the battery, and other components of the UE. Those skilled in the art will understand that the battery may operate at a nominal temperature range (e.g., 20° C. to 30° C.). However, with the increased heat, the battery may have a temperature greater than this nominal temperature range. Increased durations that the battery operates outside this nominal temperature range may ultimately decrease a useful life of the battery. This concept may also apply to other components exposed to the excessive temperatures.

In addition to the heat and temperature effects described above, the increased heat of the battery during the charging procedure while other foreground activities are being performed may also generate increased radiation. In the same way that the same amount of heat may be generated in a lesser amount of time by an increased charging rate resulting in an increased temperature as the heat is not dissipated as quickly as with a lower charging rate, the increased charging rate may also generate the same amount of radiation in a lesser time than with a lower charging rate. The same radiation in less time may increase a concentration of the radiation which may create a harmful impact to a user who is utilizing the UE in a close proximity (e.g., holding the UE against an ear during a call, holding the UE within armslength while an application is running, etc.).

In view of these adverse effects, the exemplary embodiments are configured to dynamically modify the charging rate. By throttling the charging rate, the amount of heat being generated by the UE and its components may be controlled. By controlling the amount of heat being generated, the temperature of the components including the battery may also be controlled. With the temperature of the battery being controlled, the battery may remain in a nominal operating range for a greater duration of time and emit less radiation over a period of time. As will be described in further detail below, the exemplary embodiments provide a mechanism to monitor the foreground activities and a duration for which these activities are being used as well as a temperature of the battery to form a basis upon which to select the proper charging rate for the battery. The exemplary embodiments also provide a mechanism that considers a charge capacity of the battery in selecting the proper charging rate.

FIG. 1 shows an example UE 100 according to the exemplary embodiments. The UE 100 may be configured to dynamically modify a charging rate based on whether a degradation condition exists at the UE 100. The UE 100 may represent any electronic device that is configured to recharge a battery used to power the UE 100 and include the mechanism according to the exemplary embodiments. Those skilled in the art will understand that the UE 100 may be any type of electronic component with a battery, e.g., mobile phones, tablet computers, smartphones, phablets, embedded devices, wearables, Cat-M devices, Cat-M1 devices, MTC devices, eMTC devices, other types of IoT devices, etc. The UE 100 may include a processor 105, a memory arrangement 110, a display device 115, an input/output (I/O) device 120, a transceiver 125, other components 130, a battery 135, a thermistor 137, and a charging circuit 140. The other components 130 may include, for example, an audio input device, an audio output device, a data acquisition device, ports to electrically connect the UE 100 to other electronic devices (e.g., a USB port), etc.

The processor 105 may be configured to execute a plurality of engines of the UE 100. For example, the engines may include a charging engine 145, a monitoring engine 150, an activity engine 155, and a temperature engine 160. As will be described in further detail below, the charging engine 145 may be configured to set a charging rate of the charging circuit 140 to recharge the battery 135 based on outputs of the other engines 150-160. The monitoring engine 150 may be configured to monitor a charge capacity of the battery 135. The activity engine 155 may be configured to monitor foreground activities being performed including any applications in which a user may be currently using. The temperature engine 160 may be configured to monitor a temperature of components of the UE 100, particularly the battery 135 using outputs of the thermistor 137.

It should be noted that the above noted engines 145-160 each being an application (e.g., a program) executed by the processor 105 is only exemplary. The functionality associated with the applications may also be represented as a separate incorporated component of the UE 100 or may be a modular component coupled to the UE 100, e.g., an integrated circuit with or without firmware. For example, the integrated circuit may include input circuitry to receive signals and processing circuitry to process the signals and other information. The engines 145-160 may also be embodied as one application or separate applications. In addition, the functionality described for the processor 105 may be split among two processors, a baseband processor and an applications processor. For example, information regarding network related foreground activities may be determined by the baseband processor whereas information regarding non-network related foreground activities may be determined by the applications processor.

The memory 110 may be a hardware component configured to store data related to operations performed by the UE 100. For example, the memory 110 may store the outputs of the engines 150-160 for the charging engine 145 to access and assess how to select the charging rate. The display device 115 may be a hardware component configured to show data to a user while the I/O device 120 may be a hardware component that enables the user to enter inputs. For example, while performing foreground activities, a user application may be shown to the user via the display device 115 and inputs to use the user application may be provided through the I/O device 120. It should be noted that the display device 115 and the I/O device 120 may be separate components or integrated together such as a touchscreen. The transceiver 125 may be a hardware component configured to exchange data over a network. For example, a user application used as a foreground activity may include an exchange of data or a communication using a call. The transceiver 125 may connect the UE 100 to a data network for these network related operations to be performed. Accordingly, the UE 100 may establish a connection to a network (e.g., a cellular network such as 2G, 3G, 4G, Long Term Evolution (LTE), Wideband Code Division Multiplexing Access (WCDMA), Global System for Mobile communication (GSM), new generation (NG) including 5G, WiFi, etc.

The battery 135 may be any rechargeable power supply. For example, as used with a plurality of different mobile devices such as the UE 100, the battery 135 may be a lithium ion battery. As those skilled in the art will understand, lithium ions may move from a negative electrode to a positive electrode during discharge to provide power to the UE 100. An opposite movement of the lithium ions may allow the lithium ion battery to be recharged. It is noted that the battery 135 may also be any other type of rechargeable power supply that may be recharged using the charging circuit 140 of the UE 100 (e.g., lithium polymer, lead acid, nickel metal hydride, nickel cadmium, etc.). The battery 135 may be permanently or removably incorporated with the UE 100 (e.g., inserted into a chamber of the UE 100 that is locked into position and closed to prevent removal). The battery 135 may include a first pin for the negative electrode and a second pin for the positive electrode. The UE 100 may include corresponding pins that couple to the respective electrode of the battery 135 to electrically connect the battery 135 to the UE 100. The electrical connection may be used to both recharge the battery 135 and receive a discharge to power the UE 100. Those skilled in the art will understand that the pins may refer to any type of connector that may be used to connect the battery with other components of the UE 100 or external components.

The thermistor 137 may be configured to generate information associated with determining a temperature of the battery 135. Accordingly, the thermistor 137 may act as a temperature sensor for the battery 135. The thermistor 137 may be an electrical resistor that has a resistance that is affected by temperature. The thermistor 137 may be an incorporated component of the battery 135. Thus, information from the thermistor 137 may be exchanged with the processor 105 via a third pin on the battery 135 that couples to a corresponding pin on the UE 100. The thermistor 137 may utilize a simplified mechanism to ensure that the temperature of the battery 135 is within an acceptable range. For example, a Boolean value may be used to indicate that the temperature of the battery 135 is acceptable and the charging procedure may be used. The thermistor 137 may also utilize a mechanism where more information may be conveyed. For example, a resistance value may be used to indicate a temperature of the battery 135. It is noted that the thermistor 137 is only exemplary of a temperature sensor of the battery 135. The exemplary embodiments may utilize any type of thermometer or other type of sensor that may output information used to determine the temperature of the battery 135, e.g., thermocouple, resistance thermometer, etc.

The charging circuit 140 may be any charging component configured to recharge the battery. Thus, the charging circuit 140 may be dependent on the type of battery 135 or vice versa. For a lithium ion battery, the charging circuit 140 may include a pathway for power from a continuous power supply to be used in moving the lithium ions from the positive electrode to the negative electrode. According to the exemplary embodiments, the charging circuit 140 may be set to a dynamically selected charging rate to recharge the battery. As will be described in further detail below, the charging circuit 140 may set the charging rate to any one of various charging rates and subsequently modify the charging rate setting. Some exemplary charging rate settings may include a first charging rate that corresponds to a maximum charging rate that the charging circuit 140 and the battery 135 are capable of supporting, a second charging rate that corresponds to a minimum charging rate or an equivalent to deactivating the charging procedure. In a further example, the charging circuit 140 may also be set to one or more third charging rates that are intermediary charging rates between the first and second charging rates (e.g., a percentage of the first charging rate).

As described above, the UE 100 may dynamically modify a charging rate during a charging procedure. By dynamically selecting and setting an appropriate charging rate based on conditions of the UE 100, a nominal operating range for the battery 135 may be maintained or a duration at which the battery 135 is outside the nominal operating range may be minimized. The conditions that are monitored will be described in further detail below. In this manner, the life of the battery 135 may be as close to an intended useful life and perform at a level as close to an intended performance level throughout its life. The charging rate being dynamically set may also include a further feature such as maintaining a temperature of the UE 100 at an acceptable range for a user to hold the UE 100 and/or maintaining the radiation emissions of the UE 100 to an acceptable level.

As noted above, the UE 100 may monitor various conditions of the battery 135 to determine the charging rate to be used in the charging procedure. A first condition that may be used to determine the charging rate is a charge capacity of the battery 135. The monitoring engine 150 may monitor the charge capacity of the battery 135. The charge capacity may refer to an amount of charge in the battery 135 and may be expressed as a percentage of the total charge capacity. For example, when the battery is fully charged, the charge capacity may be 100%, while when the battery is completely depleted, the charge capacity may be 0% with any charge in between also expressed as a percentage value between 0 and 100. As noted above, the charging circuit 140 may be configured to determine the charge capacity of the battery 135 using any charge identification mechanism. Thus, the charging circuit 140 may provide data to the monitoring engine 150 for the monitoring engine 150 to determine a current charge capacity of the battery 135. A corresponding output of the determined charge capacity may be provided to the charging engine 145.

A second condition that may be used to determine the charging rate is whether foreground activities are being performed with a further consideration of a duration of time that the foreground activities have been performed. The foreground activities may be related to any user associated activity or application that utilizes one or more components of the UE 100 such as the processor 105, the display device 115, the transceiver 125, etc. For example, the foreground activities may be a voice application, a VoIP application, a video call application, an email application, a browser application, a game application, a streaming application, a music application, etc. From these examples, it should be seen that the foreground activity may include communication with a network or may be self-contained within the UE 100. The activity engine 155 may monitor the foreground activities being performed. Thus, the activity engine 155 may track applications running on the processor 105, usage of components of the UE 100, etc., to determine the foreground activities. A corresponding output of the foreground activities may be provided to the charging engine 145.

A third condition that may be used to determine the charging rate is the temperature of the battery 135. As noted above, the battery 135 may have a nominal operating temperature range and operating outside the range may cause irreversible effects on the battery 135. The temperature of the battery 135 may be measured using standard units (e.g., Celsius, Fahrenheit, or Kelvin) or may be expressed as a deviation from the nominal operating temperature range. The temperature engine 160 may monitor a temperature of components of the UE 100, particularly the battery 135 using outputs of the thermistor 137. As noted above, the thermistor 137 may be configured to measure the temperature of the battery 135 using a change in resistance. Thus, the thermistor 137 may provide data to the temperature engine 160 for the temperature engine 160 to determine a current temperature or relative temperature of the battery 135. A corresponding output of the temperature may be provided to the charging engine 145.

It should be noted that the temperature engine 160 may also receive inputs from other thermistors (or other temperature sensing devices) in addition to the thermistor 137. For example, other components such as the processor 105, the memory arrangement 110, etc. may have a temperature sensing device that provides inputs to the temperature engine 160. In another example, the skin or shell of the UE 100 may include one or more temperature sensing devices that provide inputs to the temperature engine 160.

The charging engine 145 may set a charging rate of the charging circuit 140 to recharge the battery 135 based on the outputs of the monitoring engine 150, the activity engine 155, and the temperature engine 160. Initially, the charging engine 145 may determine whether the UE 100 is being charged. For example, with a wired charging mechanism, a charging port of the UE 100 may receive an end of a charging cable with the other end of the charging cable connected to a continuous power supply. Thus, the charging engine 145 may identify when the continuous power supply is being provided to the UE 100. In another example, with a wireless charging mechanism, an inductive charge may be detected to identify when the continuous power supply is being provided to the UE 100. When the charging engine 145 determines that the battery 135 is being recharged, subsequent operations may be performed to determine the charging rate to be used. It is noted that in an exemplary embodiment, the charging engine 145 may select a first charging rate when the charging procedure has been initiated. For example, the first charging rate may be a maximum charging rate. However, the use of the maximum charging rate is only exemplary and a lower charging rate may be selected as an initial charging rate to be used when the charging procedure has been initiated. In another exemplary embodiment, the charging engine 145 may not have a predetermined initial charging rate, but may perform the subsequent operations to select the charging rate to be used.

When the battery 135 is determined to be charging, the charging engine 145 may determine if a degradation condition exists. The degradation condition may relate to any condition that contributes to negatively affecting the battery 135 or any other component of the UE 100 in a temporary or permanent way. For example, the degradation condition may be a foreground activity being performed while the battery 135 is recharging or the battery 135 exceeding a predetermined temperature threshold while the battery 135 is recharging. In a specific example, the outputs of the activity engine 155 and the temperature engine 160 may provide the information that a degradation condition exists. In a particular type of foreground activity condition, the degradation condition may be when an incoming or outgoing call is made/being performed or a foreground user activity (e.g., a user application using components of the UE 100) is being used for at least a predetermined minimum duration (e.g., 5 minutes). In a particular type of temperature condition, the battery 135 may exhibit a temperature higher than the predetermined temperature threshold.

When a degradation condition exists, the charging engine 145 may set or change the charging rate to a different charging rate. For example, when only two charging rates are used, the charging engine 145 may modify the charging rate to the second charging rate where the charging engine 145 may deactivate the charging operation. In another example, when more than two charging rates are available to select for the charging procedure, the charging engine 145 may determine a degree that the degradation condition negatively affects the battery 135. For example, the temperature of the battery 135 may be determined. The determined temperature may be compared to the nominal operating temperature range to determine a degree that the temperature falls outside the nominal operating range. Accordingly, a higher degree may result in a larger decrease in the charging rate whereas a lower degree may result in a lower decrease in the charging rate. In another example, a number of foreground activities may be identified. When the number of foreground activities is relatively low (e.g., less than a first activity threshold), the charging engine 145 may set the charging rate to be less than the first, maximum charging rate by a first amount. When the number of foreground activities is at a medium level (e.g., more than the first activity threshold but less than a second activity threshold), the charging engine 145 may set the charging rate to be less than the first, maximum charging rate by a second amount greater than the first amount. When the number of foreground activities is relatively high (e.g., more than the second activity threshold), the charging engine 145 may set the charging rate to be less than the first, maximum charging rate by a third amount greater than the second amount. In a further example, combinations of the conditions may define how the charging rate is to be selected.

Prior to changing the charging rate from the initial, first, maximum charging rate, the charging engine 145 may also utilize the charge capacity of the battery 135 as a condition. Specifically, when the battery 135 is below a predetermined minimum charge threshold (e.g., 20% charge capacity), the charging engine 145 may determine that the maximum charging rate or a relatively high charging rate is to be used despite one or more degradation conditions being present. Thus, the charge capacity consideration may be an overriding parameter in selecting the charging rate when the charge capacity is less than the predetermined minimum charge threshold.

Those skilled in the art will understand that the use of the predetermined minimum charge threshold and a charging procedure may potentially raise a ping pong condition where the charging rate is set to the maximum charging rate, then set to a lower charging rate upon reaching the predetermined minimum charge threshold, then set to the maximum charging rate when the foreground activities cause the charge capacity to fall below the predetermined minimum charge threshold despite the use of the lower charging rate, etc. This scenario may repeat continuously between the maximum charging rate and the lower charging rate around the predetermined minimum charge threshold. To prevent this situation from occurring, when the charge capacity of the battery 135 is determined to be below the predetermined minimum charge threshold (e.g., 20% battery charge capacity), the charging engine 145 may maintain the first charging rate (e.g., maximum charging rate) until a charge capacity of the battery 135 reaches a safety threshold (e.g., 40% charge capacity) before the charging rate is allowed to be dynamically selected and set.

The charge capacity may also be used as a consideration on an opposite side of the charge capacity spectrum. For example, if the charge capacity is over an upper threshold (e.g., 90% charge capacity), the charging engine 145 may utilize a lower charging rate or may even deactivate the charging procedure until the degradation condition ends.

The charging engine 145 may continue to dynamically select and set the charging rate of the charging circuit 140 to recharge the battery 135 until an end factor has been determined. In a first example, the end factor may be when the charging procedure is terminated. In a second example, the end factor may be when the charging procedure is being used but the degradation condition is no longer detected. For example, the call (incoming or outgoing) has ended, the foreground activity has ended, and/or the temperature of the battery 135 is within the nominal operating temperature range.

Figure 2:
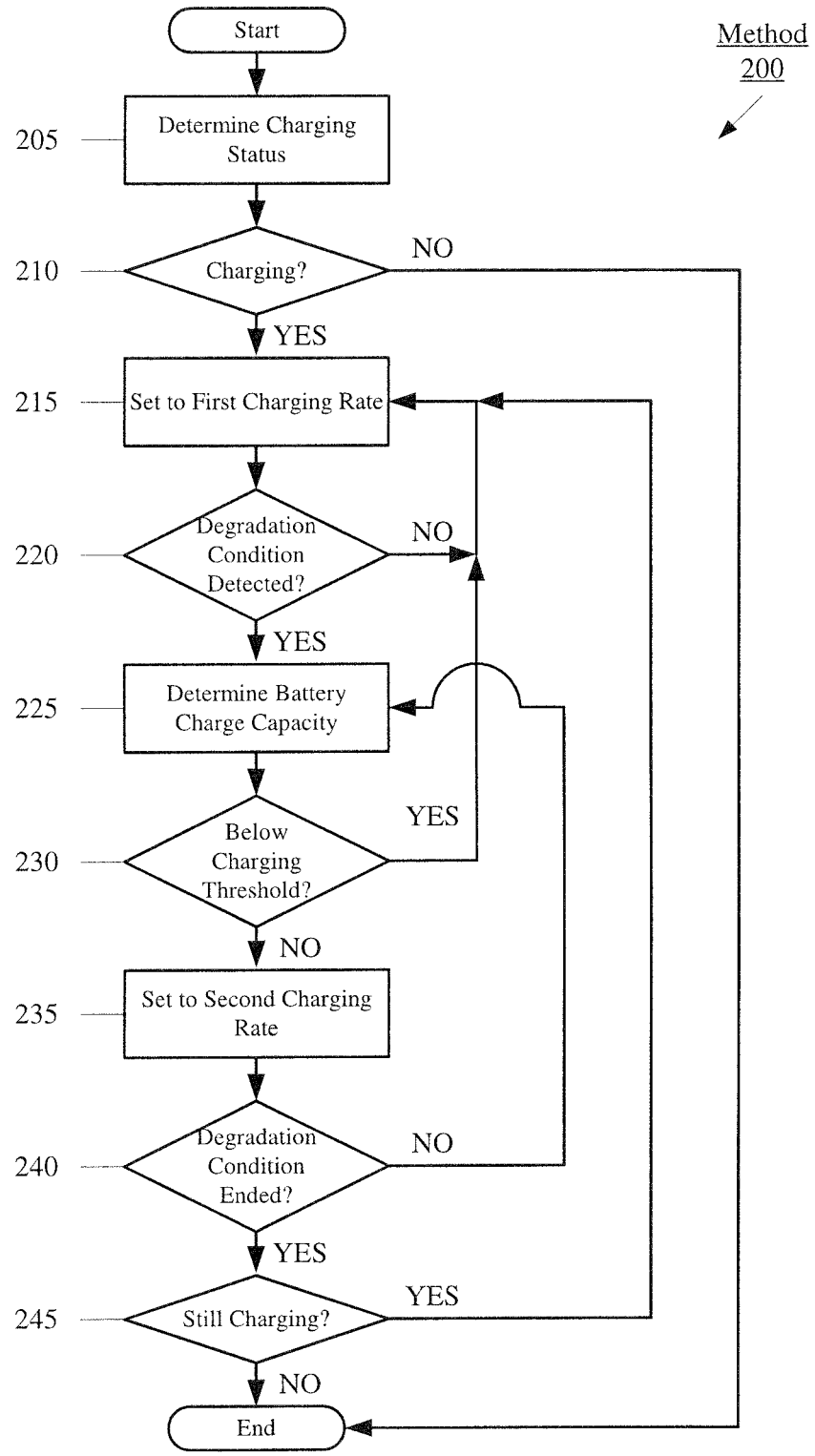
FIG. 2 shows an example method for dynamically throttling a charging rate according to the various exemplary embodiments described herein.

FIG. 2 shows an exemplary method 200 for dynamically throttling a charging rate according to the various exemplary embodiments described herein. The method 200 relates to a mechanism according to the exemplary embodiments where various conditions of the UE 100 may be monitored to determine the appropriate charging rate to set the charging circuit 140 to recharge the battery 135. The method 200 will be described with regard to the UE 100 of FIG. 1.

In 205, the UE 100 may determine a charging status of the battery 135. As described above, the charging engine 145 may determine the charging status of the battery 135 and whether the battery 135 is being recharged by the charging circuit 140. In 210, if the battery 135 is not being charged, the charging engine 145 is not required to set the charging rate. However, in 210, if the battery 135 is being recharged, the method 200 continues to 215.

In 215, the UE 100 sets the charging rate to a first charging rate. As noted above, the first charging rate may be a maximum available charging rate capable of being used by the battery 135 and the charging circuit 140. However, it is again noted that the use of an initial charging rate when the charging procedure is initiated is only exemplary. In 220, the UE 100 determines whether a degradation condition is detected. As described above, the degradation condition may be, for example, whether a foreground activity is being performed (e.g., incoming call, outgoing call, user application, etc.), a temperature of the battery 135 or other component of the UE 100 is higher than the nominal operating temperature range, etc. As noted above, network related foreground activity may be performed by a baseband processor while non-network related foreground activity may be performed by an applications processor. The temperature of the battery 135 may be determined using information provided by the thermistor 137 and monitored using the temperature engine 160.

If the UE 100 does not detect the degradation condition, the UE 100 returns to 215 where the first charging rate continues to be used. However, if the UE 100 detects the degradation condition, the UE 100 continues to 225. In 225, the UE 100 determines a charge capacity of the battery 135. As described above, the monitoring engine 150 may receive information from the charging circuit 140 identifying a current charge capacity of the battery 135. In 230, the UE 100 determines if the charge capacity is below a minimum charge threshold (e.g., 20% charge capacity). If the battery 135 is below the minimum charge capacity, the UE 100 returns to 215 for the first charging rate to continue to be used. The minimum charge capacity may be set to any value as this value is a trade-off between ensuring that the battery 135 is sufficiently recharged so as not to affect the user experience and limiting the battery 135 or other components of the UE 100 from operating outside their intended operating ranges (e.g., temperature). It is noted that the method 200 may include further operations to ensure that a ping pong effect is not experienced by using a safety threshold, as described above. However, if the battery 135 is above the minimum charge capacity, the UE 100 continues to 235 where a second, lower charging rate is set for the charging circuit 140 to recharge the battery. As described above, this second charge rate may be any rate that is less than the initial charging rate, including a suspension of the charging.

In 240, the UE 100 determines if the degradation condition has ended. For example, the user may have terminated any foreground user application or ended a call. If the degradation condition continues, the UE 100 returns to 225 where the charge capacity is again analyzed to determine if the charging rate is to be modified. If the degradation condition has ended, the UE 100 continues to 245 to determine if the UE 100 is still charging. If the UE 100 is still charging and the degradation condition has ended, the UE 100 returns to 215 where the first charging rate is set for the charging circuit 140.

It is noted that the method 200 is described with various determinations and corresponding operations. However, the method 200 is not described with any particular order in which the determinations/operations are performed. Accordingly, particular determinations/operations in the method 200 may be re-arranged. For example, the charge capacity may be determined prior to the degradation condition being detected. This arrangement may allow for the overriding parameter of the charge capacity to be used without having to perform any determinations/operations associated with the degradation condition.

The exemplary embodiments provide a device, system, and method of dynamically setting a charging rate for a charging circuit recharging a battery of a UE when the battery is being recharged and a degradation condition is present. With heat being generated from the charging procedure, the battery may reach an unacceptable temperature that affects the longevity of the battery. The unacceptable temperature may also be contributed by foreground activities being performed and components of the UE being used while the battery is being recharged. To maintain the battery in a nominal operating performance range (e.g., preventing the battery from exceeding a nominal operating temperature range), the mechanism according to the exemplary embodiments modify the charging rate accordingly.

Those skilled in the art will understand that the above-described exemplary embodiments may be implemented in any suitable software or hardware configuration or combination thereof. An exemplary hardware platform for implementing the exemplary embodiments may include, for example, an Intel x86 based platform with compatible operating system, a Windows OS, a Mac platform and MAC OS, a mobile device having an operating system such as iOS, Android, etc. In a further example, the exemplary embodiments of the above described method may be embodied as a program containing lines of code stored on a non-transitory computer readable storage medium that, when compiled, may be executed on a processor or microprocessor.

It will be apparent to those skilled in the art that various modifications may be made in the present invention, without departing from the spirit or the scope of the invention. Thus, it is intended that the present invention cover modifications and variations of this invention provided they come within the scope of the appended claims and their equivalent.

What is claimed is:

1. A user equipment, comprising:
    a rechargeable battery;
    a charging circuit configured to control a recharging operation for the rechargeable battery; and
    a processor configured to determine an activity condition and a charge condition, the activity condition based on a foreground activity running on the user equipment, the charge condition based on a charge capacity of the rechargeable battery being above a capacity threshold, the processor configured to select a first charging rate at which the charging circuit recharges the rechargeable battery when at least one of the activity condition and the charge condition is absent, the processor configured to select a second charging rate when the activity condition and the charge condition are present, the second charging rate being less than the first charging rate.

2. The user equipment of claim 1, wherein the activity condition increases a temperature of one of the rechargeable battery, another component of the user equipment, or a skin of the user equipment.

3. The user equipment of claim 2, further comprising at least one of a display device, an input/output (I/O) device, or a transceiver.

4. The user equipment of claim 3, wherein the foreground activity uses at least one of the processor, the display device, the I/O device, or the transceiver.

5. The user equipment of claim 4, wherein the processor includes a baseband processor and an applications processor, the baseband processor identifying when the foreground activity is a network related foreground activity, the applications processor identifying when the foreground activity is a non-network related foreground activity.

6. The user equipment of claim 4, wherein the activity condition is present when the foreground activity is running for a predetermined minimum duration.

7. The user equipment of claim 2, further comprising:
    a temperature sensor configured to determine the temperature of the rechargeable battery.

8. The user equipment of claim 7, wherein the activity condition is present when the temperature of the rechargeable battery exceeds a nominal operating temperature range.

9. The user equipment of claim 1, further comprising:
    a monitoring component configured to identify the charge capacity of the rechargeable battery.

10. The user equipment of claim 9, wherein the monitoring component is incorporated in the charging circuit.

11. The user equipment of claim 1, wherein the first charging rate is a maximum charging rate, and wherein the second charging rate is a zero charging rate.

12. The user equipment of claim 1, wherein the processor selects an initial charging rate when the rechargeable battery is initially recharged.

13. The user equipment of claim 12, wherein the initial charging rate is a maximum charging rate.

14. The user equipment of claim 1, wherein the capacity threshold is 20% of a full charge capacity of the rechargeable battery.

15. The user equipment of claim 1, wherein the rechargeable battery is a lithium ion battery.

16. A method, comprising:
    at a user equipment comprising a rechargeable battery and a charging circuit configured to recharge the rechargeable battery:
    determining an activity condition and a charge condition, the activity condition based on a foreground activity running on the user equipment, the charge condition based on a charge capacity of the rechargeable battery being above a capacity threshold;

selecting a first charging rate at which the charging circuit recharges the rechargeable battery when at least one of the activity condition and the charge condition is absent; and selecting a second charging rate when the activity condition and the charge condition are present, the second charging rate being less than the first charging rate.

17. The method of claim 16, wherein the activity condition increases a temperature of the rechargeable battery, another component of the user equipment, or a skin of the user equipment.

18. The method of claim 17, wherein the activity condition is present when the temperature of the rechargeable battery exceeds a nominal operating temperature range of the rechargeable battery.

19. The method of claim 16, wherein the first charging rate is a maximum charging rate, and wherein the second charging rate is a zero charging rate.

20. A charging integrated circuit, comprising:

a battery port configured to establish an electrical connection with a rechargeable battery;

first circuitry for controlling a recharging operation of the rechargeable battery while the charging integrated circuit is connected to a continuous power supply; and second circuitry for receiving an indication identifying a charging rate at which the rechargeable battery is recharged, wherein the indication sets the charging rate to a first charging rate at which the rechargeable battery is recharged when at least one of an activity condition and a charge condition is absent, the activity condition based on a foreground activity running on a user equipment, the charge condition based on a charge capacity of the rechargeable battery being above a capacity threshold, and wherein the indication sets the charging rate to a second charging rate when the activity condition and the charge condition are present, the second charging rate being less than the first charging rate.

* * * * *